United States Patent [19]
Dorri et al.

[11] Patent Number: 5,565,831
[45] Date of Patent: Oct. 15, 1996

[54] SHIELDED AND OPEN MRI MAGNET

[75] Inventors: Bizhan Dorri, Clifton Park; Evangelos T. Laskaris, Schenectady; Michele D. Ogle, Burnt Hills, all of N.Y.; Timothy J. Havens, Florence, S.C.

[73] Assignee: General Electric Company, Schenectady, N.Y.

[21] Appl. No.: 547,083

[22] Filed: Oct. 23, 1995

[51] Int. Cl.$^6$ .................................................. G01V 3/00
[52] U.S. Cl. ........................ 335/216; 335/301; 324/318; 324/319
[58] Field of Search .................................... 335/216, 299, 335/301; 324/318, 319, 320; 128/653.1; 505/844, 879

[56] References Cited

U.S. PATENT DOCUMENTS

| | | | |
|---|---|---|---|
| 4,724,412 | 2/1988 | Kalafala | 335/299 |
| 4,924,198 | 5/1990 | Laskaris | 335/216 |
| 5,237,300 | 8/1993 | Ige et al. | 335/299 |
| 5,291,169 | 3/1994 | Ige et al. | 335/216 |
| 5,309,106 | 5/1994 | Miyajima et al. | 324/318 |
| 5,389,909 | 2/1995 | Havens | 335/216 |
| 5,410,287 | 4/1995 | Laskaris et al. | 335/216 |
| 5,448,214 | 9/1995 | Laskaris | 335/301 |
| 5,463,364 | 10/1995 | Miller | 335/299 |

OTHER PUBLICATIONS

Pending U.S. Patent No. 5,517,169 filed Oct. 17, 1994, by E. T. Laskaris et al., entitled "Superconducting Magnet with Magnet Shielding".

Pending U.S. Patent No. 5,517,168, filed Oct. 17, 1994, by E. T. Laskaris et al., entitled "Superconducting Magnet with Magnet Shielding".

Concurrently filled U.S. Patent Application RD–24637, by Bizhan Dorri et al., entitled "Cryogenic–Fluid–Cooled Open MRI Magnet with Uniform Magnetic Field", Serial No. 08/547085.

Concurrently filed U.S. Patent Application RD–24648, by Bizhan Dorri et al., entitled "Open MRI Magnet with Homogeneous Imaging Volume", Serial No. 08/547002.

Primary Examiner—Brian W. Brown
Assistant Examiner—Raymond M. Barrera
Attorney, Agent, or Firm—Douglas E. Erickson; Marvin Snyder

[57] ABSTRACT

A shielded and open magnetic resonance imaging (MRI) magnet having two spaced-apart, generally toroidal-shaped superconductive coil assemblies. Each coil assembly has a coil housing containing a generally annular-shaped superconductive main and a radially-outwardly spaced-apart shielding coil carrying electric currents in opposing directions. Preferably, supplemental shielding is provided with the addition of: a generally annular permanent magnet configuration internal to, or external of, the coil housings; a generally-non-permanently-magnetized external ferromagnetic shield having at least a portion positioned longitudinally between the coil housings; an external resistive coil; or combinations thereof.

10 Claims, 2 Drawing Sheets

SHIELDED AND OPEN MRI MAGNET

BACKGROUND OF THE INVENTION

The present invention relates generally to an open superconductive magnet used to generate a uniform magnetic field as part of a magnetic resonance imaging (MRI) system, and more particularly to such a magnet having shielding to protect the area around the magnet from stray magnetic fields originating from the magnet.

MRI systems employing superconductive magnets are used in various fields such as medical diagnostics. Known superconductive magnets include liquid-helium-cooled and cryocooler-cooled superconductive magnets. Typically, the superconductive coil assembly includes a superconductive main coil surrounded by a thermal shield surrounded by a vacuum enclosure. A cryocooler-cooled magnet preferably also includes a cryocooler coldhead externally mounted to the vacuum enclosure, having its first stage in thermal contact with the thermal shield, and having its second stage in thermal contact with the superconductive main coil. A liquid-helium-cooled magnet preferably also includes a liquid-helium container surrounding the superconductive main coil and a second thermal shield which surrounds the liquid-helium container and which itself is surrounded by the thermal shield.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a spherical imaging volume centered within the magnet's bore where the object to be imaged is placed. A single, tubular-shaped superconductive shielding assembly may also be used to prevent the high magnetic field created by and surrounding the main coils from adversely interacting with electronic equipment in the vicinity of the magnet. Such shielding assembly includes several radially-aligned and longitudinally spaced-apart superconductive shielding coils carrying electric currents of generally equal amperage, but in an opposite direction, to the electric current carried in the main coils and positioned radially outward of the main coils.

Open magnets typically employ two spaced-apart superconductive coil assemblies with the space between the assemblies allowing for access by medical personnel for surgery or other medical procedures during MRI imaging. The patient may be positioned in that space or also in the bore of the toroidal-shaped coil assemblies. The open space helps the patient overcome any feelings of claustrophobia that may be experienced in a closed magnet design. Open magnets may be shielded passively, but that would take away the openness of the magnet. Shielding the room (instead of the magnet) is too expensive to consider in many installations.

SUMMARY OF THE INVENTION

It is an object of the invention to provide an open superconductive MRI magnet having superconductive shielding.

The open magnetic resonance imaging magnet of the invention includes first and second superconductive coil assemblies each including a generally toroidal-shaped coil housing, a generally annular-shaped superconductive main coil, and a generally annular-shaped superconductive shielding coil. A coil assembly's coil housing, main coil, and shielding coil are all generally coaxially aligned. A coil assembly's main coil and shielding coil are located within its coil housing and carry electric currents in opposite directions. A coil assembly's shielding coil is spaced radially outward and radially apart from its main coil. The two coil housings are longitudinally spaced apart.

Preferably, at least one of three types of non-superconductive shielding supplements the shielding of the two superconductive shielding coils of the open magnet. The first type employs a generally annular permanent magnet array or assemblage either located within a coil housing and spaced radially outward and radially apart from the main coil or located outside and radially outward of a coil housing. The second type employs a generally-non-permanently-magnetized ferromagnetic shield outside and radially outward of a coil housing. The third type employs a resistive coil outside and radially outward of a coil housing.

In an exemplary embodiment, the shielded and open MRI magnet employs a superconductive bucking coil within a coil housing (or non-superconductive apparatus inside or outside a coil housing) for shaping the magnetic field within the imaging volume located longitudinally between the two coil housings.

Several benefits and advantages are derived from the invention. The superconductive shielding coils provide compact magnetic shielding for the open magnet. Use of a supplemental ferromagnetic shield, an annular permanent magnet array, and/or a resistive coil to supplement the superconductive shielding coils allows the same overall shielding level to be achieved but with weaker superconductive shielding coils which reduces costs. It is noted that using just the supplemental shielding alone to achieve a desired shielding level would result in a bulky shielding design. Employing the superconductive bucking coils and/or the non-superconductive apparatus will improve the magnetic field homogeneity within the imaging volume of the shielded and open magnet, thus improving the quality of the MRI imaging.

BRIEF DESCRIPTION OF THE DRAWINGS

The accompanying drawings illustrate several preferred embodiments of the present invention, with the magnet's cooling omitted for clarity, wherein.

DETAILED DESCRIPTION OF THE INVENTION

Figure 1:
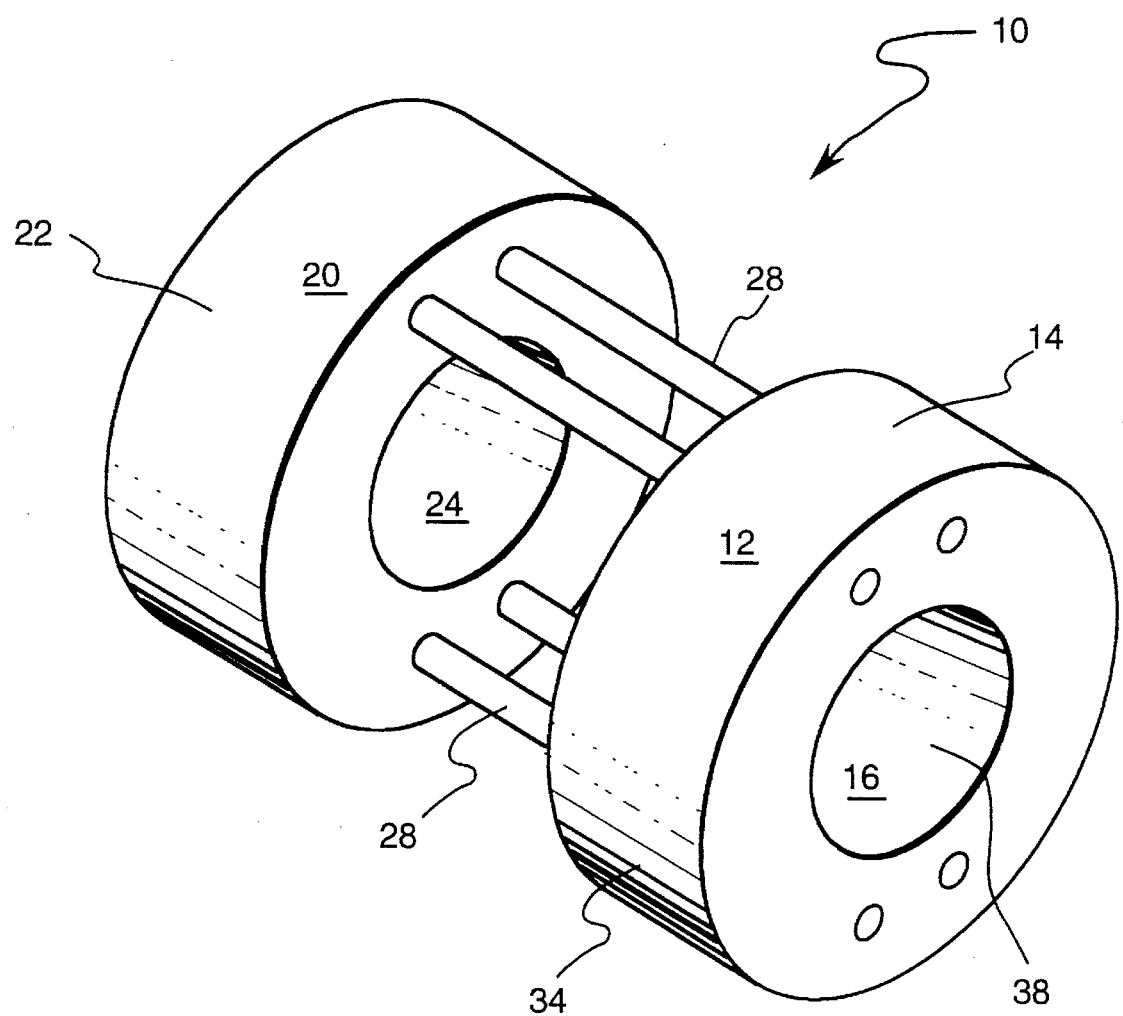
FIG. 1 is a perspective view of a first preferred embodiment of the open MRI magnet of the invention shielded by just the internal superconductive shielding coils, but with the magnet's accompanying/floor mount omitted for clarity.
Figure 2:
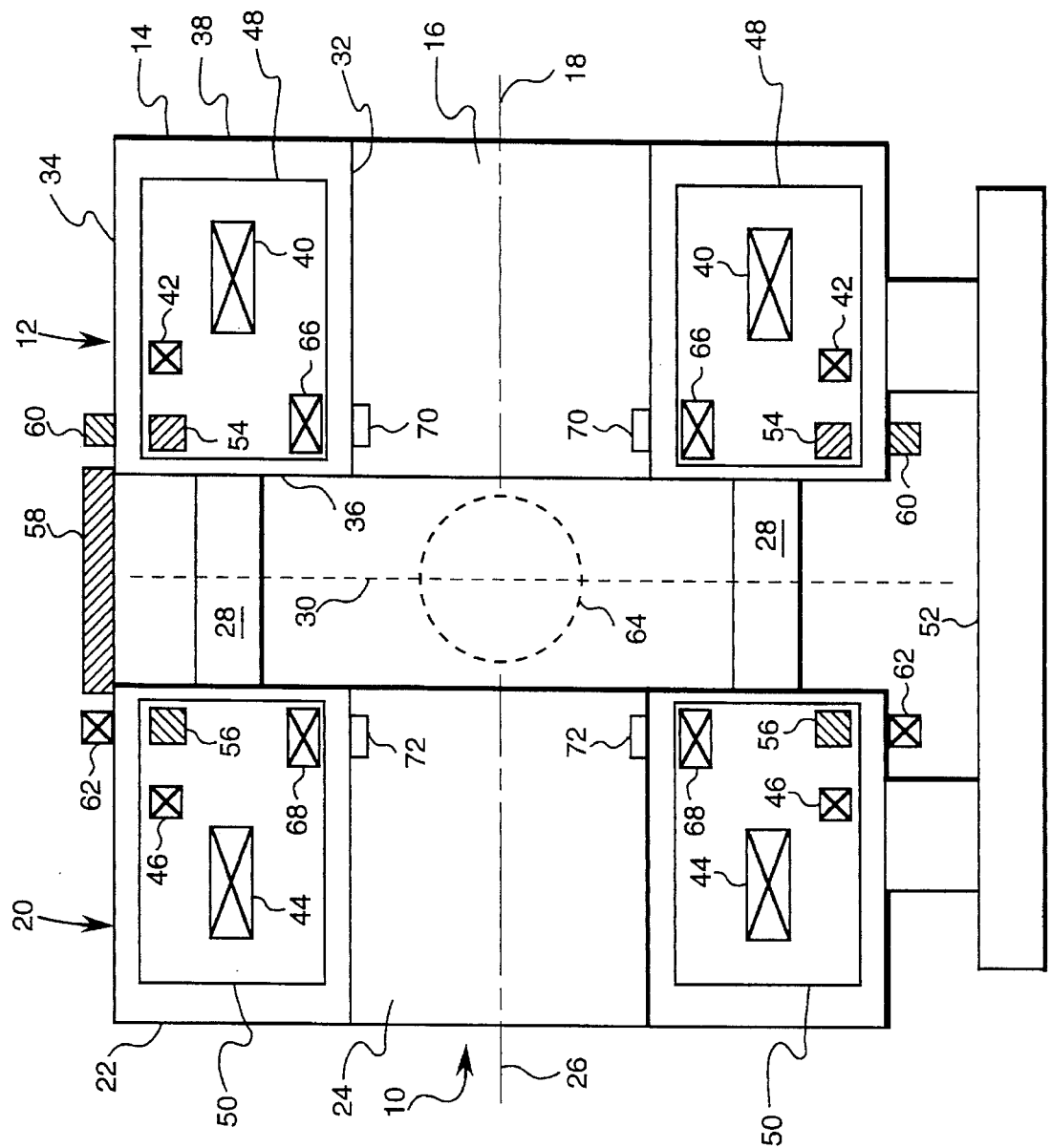
FIG. 2 is a schematic cross-sectional side-elevational view of the MRI magnet of FIG. 1 with several supplemental shielding arrangements and a magnet floor mount added.

Referring now to the drawings, wherein like numerals represent like elements throughout, FIGS. 1–2 show several preferred embodiments of the open magnetic resonance imaging (MRI) magnet 10 of the present invention. The magnet 10 includes a first superconductive coil assembly 12 with a generally toroidal-shaped first coil housing 14 which surrounds a first bore 16 and which has a generally longitudinal first axis 18. The magnet 10 further includes a second superconductive coil assembly 20 with a generally toroidal-shaped second coil housing 22 which surrounds a second bore 24 and which has a generally longitudinal second axis 26. The second coil housing 22 is longitudinally spaced apart from the first coil housing 14 by structural posts 28, and the second axis 26 is generally coaxially aligned with the first axis 18. Preferably, the second superconductive coil assembly 20 is a generally mirror image of the first superconductive coil assembly 12 about a plane 30 (seen on edge as a dashed line in FIG. 2) oriented perpendicular to the first axis 18 and disposed longitudinally midway between the first and second coil housings 14 and 22.

The first coil housing 14 includes a first generally-circumferential outside surface 32 facing generally towards the first axis 18 (i.e., facing in a radially inward direction) and a second generally-circumferential outside surface 34 radially spaced apart from the first circumferential outside surface 32 and facing generally away from the first axis 18 (i.e., facing in a radially outward direction). The first coil housing 14 also includes a first generally-annular outside surface 36 facing generally towards the plane 30 (i.e., facing in a longitudinally inward direction) and a second generally-annular outside surface 38 longitudinally spaced apart from the first annular outside surface 36 and facing generally away from the plane 30 (i.e., facing in a longitudinally outward direction).

The first superconductive coil assembly 12 also includes a generally annular-shaped first superconductive main coil 40, preferably additional superconductive main coils (not shown in the figures), and a generally annular-shaped first superconductive shielding coil 42. The first superconductive coils 40 and 42 are conventionally supported on coil forms (not shown in the figures). The first superconductive main coil 40 typically would be a superconductive wire or superconductive tape wound such that the first superconductive main coil 40 has a longitudinal extension and a radial extension (i.e., radial thickness) far greater than the corresponding dimensions of the superconductive wire or superconductive tape.

The first superconductive main coil 40 is generally coaxially aligned with the first axis 18, is disposed within the first coil housing 14, and carries a first main electric current in a first direction. The first direction is defined to be either a clockwise or a counterclockwise circumferential direction about the first axis 18 with any slight longitudinal component of current direction being ignored. The preferred additional superconductive main coils may be needed to achieve a high magnetic field strength, within the magnet's imaging volume, without exceeding the critical current density of the superconductor being used in the superconductive coils, as is known to those skilled in the art.

The first superconductive shielding coil 42 is generally coaxially aligned with the first axis 18, is disposed within the first coil housing 14, and carries a first shielding electric current in a direction opposite to the first direction (i.e., in a direction opposite to the direction of the electric current carried by the first superconductive main coil 40). The first superconductive shielding coil 42 is spaced radially outward and radially apart from the first superconductive main coil 40. Preferably, the first superconductive main coil 40 has (as previously mentioned) a radial thickness, and the first superconductive shielding coil 42 is radially spaced apart from the first superconductive main coil 40 a distance equal generally to at least three times the radial thickness of the first superconductive main coil 40. It is preferred that the first main electric current of the first superconductive main coil 40 and the first shielding electric current of the first superconductive shielding coil 42 are generally equal in amperage.

As previously mentioned and as shown in the figures, the second superconductive coil assembly 20 is a generally mirror image of the first superconductive coil assembly 12 about the plane 30. Therefore, in addition to the second coil housing 22, the second superconductive coil assembly 20 also includes a generally annular-shaped second superconductive main coil 44, preferably additional superconductive main coils (not shown in the figures), and a generally annular-shaped second superconductive shielding coil 46. The second superconductive coils 44 and 46 are conventionally supported on coil forms (not shown in the figures).

The second superconductive main coil 44 is generally coaxially aligned with the second axis 26, is disposed within the second coil housing 22, and carries a second main electric current in the first direction (i.e., in the same direction as the electric current in the first superconductive main coil 40). The preferred additional main coils may be needed by the second superconductive coil assembly 20 to balance any extra additional main coils of the first superconductive coil assembly 12, as can be appreciated by those skilled in the art.

The second superconductive shielding coil 46 is generally coaxially aligned with the second axis 26, is disposed within the second coil housing 22, and carries a second shielding electric current in a direction opposite to the first direction (i.e., in a direction opposite to the direction of the electric current carried by the first superconductive main coil 40). The second superconductive shielding coil 46 is spaced radially outward and radially apart from the second superconductive main coil 44.

It is noted that the superconductive coils 40, 42, 44, and 46 of the open MRI magnet of the present invention preferably are cooled to a temperature below their critical temperature to achieve and sustain superconductivity by liquid-helium (or other cryogenic) cooling, by cryocooler cooling, or by a combination thereof. Such cooling, which is known to those skilled in the art, does not form a part of the present invention and has been omitted from the figures for clarity. However, preferably, the first and second coil housings 14 and 22 are first and second vacuum enclosures, and at least one conventional thermal shield 48 and 50 is interposed between the superconductive coils and the vacuum enclosure of the corresponding superconductive coil assembly 12 or 20 as shown in FIG. 2. The coil housings 14 and 22 may be separate vacuum containers, or at least one of the structural posts 28 may be hollow such that the coil housings 14 and 22 together provided a single vacuum container. It is further noted that the magnet 10 preferably is supported on a conventional magnet floor mount 52.

In a first preferred embodiment of the open magnet 10 of the present invention, depicted in FIG. 1, all of the shielding is accomplished by the internal (i.e., internal to the coil housings 14 and 22) first and second superconductive shielding coils 42 and 46.

A second preferred embodiment supplements the shielding of weaker (and less costly) superconductive shielding coils with an internal annular permanent magnet array. Here, the first superconductive coil assembly 12 also includes a first generally annular permanent magnet array 54 generally coaxially aligned with the first axis 18 and disposed within the first coil housing 14, and the second superconductive coil assembly 20 also includes a second generally annular permanent magnet array 56 generally coaxially aligned with the second axis 26 and disposed within the second coil housing 22. The first annular permanent magnet array 54 is spaced radially outward and radially apart from the first superconductive main coil 40 and is spaced longitudinally inward and longitudinally apart from the first superconductive shielding coil 42, and the second annular permanent magnet array 56 is spaced radially outward and radially apart from the second superconductive main coil 44 and is spaced longitudinally inward and longitudinally apart from the second superconductive shielding coil 46. It is noted that each annular permanent magnet array 54 and 56 preferably is made up of a plurality of circumferentially-spaced-apart individual magnets. The individual magnets are oriented such that each annular permanent magnet array 54 and 56 has an optimized magnetic field direction generally parallel to the first and second axes 18 and 26 and generally opposite to the direction of the magnetic field produced by the first and second superconductive main coils 40 and 44.

A third preferred embodiment supplements the shielding of weaker (and less costly) superconductive shielding coils with a generally-non-permanently-magnetized ferromagnetic (e.g., carbon steel) shield 58 disposed outside and radially outward of the first and second coil housings 14 and 22. Typically, the ferromagnetic shield 58 would not project longitudinally outward beyond the second annular outside surface 38 of the first coil housing 14 and the corresponding surface of the second coil housing 22. In an exemplary embodiment, at least a portion (and preferably all) of the ferromagnetic shield 58 is disposed longitudinally between (and preferably longitudinally overlapping and attached to) the first and second coil housings 14 and 22 proximate the top (as shown in FIG. 2) and the bottom (omitted from FIG. 2 for clarity) of the open magnet 10. The ferromagnetic shield 58 is not placed longitudinally between the coil housings 14 and 22 on the sides of the open magnet 10 because that would close off the open space needed by the doctors for patient access and needed by the patients for comfort to overcome any feelings of claustrophobia. In one preferred construction, the ferromagnetic shield 58 includes a plurality of spaced-apart ferromagnetic-shield portions wherein some of the ferromagnetic-shield portions are located inside the walls of the room containing the open magnet 10.

A fourth preferred embodiment supplements the shielding of weaker (and less costly) superconductive shielding coils with a generally annular permanent magnet assemblage 60 generally coaxially aligned with the first axis 18 and disposed outside and radially outward of the first coil housing 14. In a preferred construction (not shown in the figures), another such assemblage is associated with the second coil housing 22. Preferably, the annular permanent magnet assemblage 60 is attached to the first coil housing 14. The annular permanent magnet assemblage 60, which preferably includes a plurality of circumferentially-spaced-apart individual magnets, has an optimized magnetic field direction generally parallel to the first axis 18 and generally opposite to the magnetic field direction of the first superconductive main coil 40.

A fifth preferred embodiment supplements the shielding of weaker (and less costly) superconductive shielding coils with a resistive shielding coil 62 generally coaxially aligned with the second axis 26 and disposed outside and radially outward of the second coil housing 22. The resistive shielding coil 62 carries an electric current in a direction opposite to the first direction (i.e., in a direction identical to the direction of the shielding electric current carried by the second superconductive shielding coil 46). In a preferred construction (not shown in the figures), another such resistive shielding coil is associated with the first coil housing 14. Preferably, the resistive shielding coil 62 is attached to the second coil housing 22.

It is noted that the open MRI magnet 10 has an imaging volume 64 disposed longitudinally between the first and second coil housings 14 and 22, and that the imaging volume 64 includes a magnetic field.

In a first exemplary enablement, the first superconductive coil assembly 12 also includes a generally annular-shaped first superconductive bucking coil 66, and the second superconductive coil assembly 20 also includes a generally annular-shaped second superconductive bucking coil 68. The first superconductive bucking coil 66 is generally coaxially aligned with the first axis 18, is disposed within the first coil housing 14, and carries a first bucking electric current in a direction opposite to the first direction (i.e., in a direction opposite to the direction of the electric current carried by the first superconductive main coil 40). The first superconductive bucking coil 66 is spaced radially inward and radially apart from the first superconductive main coil 40. The second superconductive bucking coil 68 is generally coaxially aligned with the second axis 26, is disposed within the second coil housing 22, and carries a second bucking electric current in a direction opposite to the first direction (i.e., in a direction opposite to the direction of the electric current carried by the first superconductive main coil 40). The second superconductive bucking coil 68 is spaced radially inward and radially apart from the second superconductive main coil 44. The effect of the superconductive bucking coils 66 and 68 is to improve the magnetic field homogeneity within the imaging volume 64.

In a second exemplary enablement, the first superconductive coil assembly 12 also includes first non-superconductive means 70 for shaping the magnetic field within the imaging volume 64, and the second superconductive coil assembly 20 also includes second non-superconductive means 72 for shaping the magnetic field within the imaging volume 64. The first means 70 is disposed radially inward and radially apart from the first superconductive main coil 40, and the second means 72 is disposed radially inward and radially apart from the second superconductive main coil 44. Preferably, such first and second means 70 and 72 each include a generally annular permanent magnet arrangement, a generally-non-permanently-magnetized and generally-annular ferromagnetic ring, a resistive DC (direct current) coil, or combinations thereof. The first and second means 70 and 72 may be disposed inside or outside the coil housings 14 and 22.

Using the principles of the present invention, previously disclosed herein, together with conventional magnetic field analysis, as is within the skill of the artisan, the open magnet 10 can be designed to have a spherical imaging volume 64 (shown as a dotted circle in FIG. 2) centered generally at the intersection of the plane 30 and the first axis 18, with a magnetic field of generally 0.5 Tesla, a design peak-to-peak magnetic field inhomogeneity of less than 3 parts per million (ppm), and a diameter of generally 12 inches, and the open magnet 10 can (using both superconductive shielding coils and supplemental shielding) be relatively compactly and inexpensively designed to have a 5 Gauss stray field located longitudinally and radially generally half the distance from the center of the imaging volume 64 of the open magnet 10 compared to no shielding.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:
1. An open magnetic resonance imaging magnet comprising:
   a) a first superconductive coil assembly including:
      (1) a generally toroidal-shaped first coil housing surrounding a first bore and having a generally longitudinal first axis;
      (2) a generally annular-shaped first superconductive main coil generally coaxially aligned with said first axis, disposed within said first coil housing, and carrying a first main electric current in a first direction; and
      (3) a generally annular-shaped first superconductive shielding coil generally coaxially aligned with said first axis, disposed within said first coil housing, and carrying a first shielding electric current in a direction opposite to said first direction, wherein said first superconductive shielding coil is spaced radially outward and radially apart from said first superconductive main coil; and
   b) a second superconductive coil assembly including:
      (1) a generally toroidal-shaped second coil housing longitudinally spaced apart from said first coil housing, surrounding a second bore, and having a generally longitudinal second axis generally coaxially aligned with said first axis;
      (2) a generally annular-shaped second superconductive main coil generally coaxially aligned with said second axis, disposed within said second coil housing, and carrying a second main electric current in said first direction; and
      (3) a generally annular-shaped second superconductive shielding coil generally coaxially aligned with said second axis, disposed within said second coil housing, and carrying a second shielding electric current in said opposite direction, wherein said second superconductive shielding coil is spaced radially outward and radially apart from said second superconductive main coil.

2. The magnet of claim 1,
   wherein said first main electric current and said first shielding electric current are generally equal in amperage,
   wherein said first superconductive main coil has a radial thickness and said first superconductive shielding coil is radially spaced apart from said first superconductive main coil a distance equal generally to at least three times the radial thickness of said first superconductive main coil, and
   wherein said second superconductive coil assembly is a generally mirror image of said first superconductive coil assembly about a plane oriented perpendicular to said first axis and disposed longitudinally midway between said first and second coil housings.

3. The magnet of claim 2,
   wherein said first superconductive coil assembly also includes a first generally annular permanent magnet array generally coaxially aligned with said first axis and disposed within said first coil housing, wherein said first annular permanent magnet array is spaced radially outward and radially apart from said first superconductive main coil and is spaced longitudinally inward and longitudinally apart from said first superconductive shielding coil, and
   wherein said second superconductive coil assembly also includes a second generally annular permanent magnet array generally coaxially aligned with said second axis and disposed within said second coil housing, wherein said second annular permanent magnet array is spaced radially outward and radially apart from said second superconductive main coil and is spaced longitudinally inward and longitudinally apart from said second superconductive shielding coil.

4. The magnet of claim 2, also including a generally-non-permanently-magnetized ferromagnetic shield disposed outside and radially outward of said first and second coil housings.

5. The magnet of claim 4, wherein at least a portion of said ferromagnetic shield is disposed longitudinally between said first and second coil housings.

6. The magnet of claim 2, also including:
   c) a generally annular permanent magnet assemblage generally coaxially aligned with said first axis and disposed outside and radially outward of said first coil housing.

7. The magnet of claim 6, wherein said annular permanent magnet assemblage is attached to said first coil housing.

8. The magnet of claim 2, also including:
   c) a resistive shielding coil generally coaxially aligned with said second axis and disposed outside and radially outward of said second coil housing.

9. The magnet of claim 2,
   wherein said first superconductive coil assembly also includes a generally annular-shaped first superconductive bucking coil generally coaxially aligned with said first axis, disposed within said first coil housing, and carrying a first bucking electric current in said opposite direction, and wherein said first superconductive bucking coil is spaced radially inward and radially apart from said first superconductive main coil, and
   wherein said second superconductive coil assembly also includes a generally annular-shaped second superconductive bucking coil generally coaxially aligned with said second axis, disposed within said second coil housing, and carrying a second bucking electric current in said opposite direction, and wherein said second superconductive bucking coil is spaced radially inward and radially apart from said second superconductive main coil.

10. The magnet of claim 2,
   wherein said magnet includes an imaging volume disposed longitudinally between said first and second coil housings and said imaging volume includes a magnetic field,
   wherein said first superconductive coil assembly also includes first non-superconductive means for shaping the magnetic field within the imaging volume, said first non-superconductive field-shaping means disposed radially inward and radially apart from said first superconductive main coil, and
   wherein said second superconductive coil assembly also includes second non-superconductive means for shaping the magnetic field within the imaging volume, said second non-superconductive field-shaping means disposed radially inward and radially apart from said second superconductive main coil.

* * * * *